United States Patent
Jeong et al.

(10) Patent No.: US 9,384,964 B1
(45) Date of Patent: Jul. 5, 2016

(54) METHOD OF MANUFACTURING SEMICONDUCTOR DEVICE

(71) Applicant: Samsung Electronics Co., Ltd., Suwon-Si, Gyeonggi-Do (KR)

(72) Inventors: Yongkuk Jeong, Suwon-si (KR); Hyeonbeom Gwon, Seoul (KR); Junghwa Seo, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/449,421

(22) Filed: Aug. 1, 2014

(51) Int. Cl.
H01L 21/02 (2006.01)
H01L 29/66 (2006.01)
H01L 21/324 (2006.01)

(52) U.S. Cl.
CPC .... *H01L 21/02236* (2013.01); *H01L 21/02318* (2013.01); *H01L 21/324* (2013.01)

(58) Field of Classification Search
None
See application file for complete search history.

(56) References Cited

U.S. PATENT DOCUMENTS

| | | | |
|---|---|---|---|
| 8,168,548 B2 | 5/2012 | Leusink | |
| 8,497,192 B2 | 7/2013 | Ishibashi et al. | |
| 8,551,846 B2 | 10/2013 | Kim et al. | |
| 8,623,728 B2 | 1/2014 | Chang et al. | |
| 2008/0078987 A1* | 4/2008 | Leusink | 257/19 |
| 2009/0029529 A1 | 1/2009 | Shin | |
| 2010/0072515 A1 | 3/2010 | Park et al. | |
| 2011/0024804 A1 | 2/2011 | Chang et al. | |
| 2011/0147737 A1* | 6/2011 | Yamazaki | H01L 27/11517 257/43 |
| 2011/0183493 A1 | 7/2011 | Daval et al. | |
| 2012/0009764 A1 | 1/2012 | Ishibashi et al. | |
| 2012/0244670 A1* | 9/2012 | Do et al. | 438/229 |
| 2012/0244674 A1 | 9/2012 | Kim et al. | |
| 2012/0329230 A1* | 12/2012 | Chudzik et al. | 438/287 |
| 2015/0255581 A1* | 9/2015 | Lin | H01L 29/66795 257/401 |

FOREIGN PATENT DOCUMENTS

KR  100409033 B1  12/2003

* cited by examiner

*Primary Examiner* — Pamela E Perkins
(74) *Attorney, Agent, or Firm* — Harness, Dickey & Pierce, PLC

(57) ABSTRACT

The inventive concepts provide methods of manufacturing a semiconductor device including a thermal treatment process. The method may include providing a substrate including a channel region of a transistor, forming an initial oxide layer on the channel region, and performing a thermal treatment process at least once before or after forming the initial oxide layer.

15 Claims, 14 Drawing Sheets

METHOD OF MANUFACTURING SEMICONDUCTOR DEVICE

TECHNICAL FIELD

The inventive concepts relate to methods of manufacturing a semiconductor device and, more particularly, to methods of manufacturing a semiconductor device capable of improving reliability of a gate dielectric layer of a transistor.

DESCRIPTION OF RELATED ART

As semiconductor devices have been highly integrated and design rules have been reduced, thicknesses of gate dielectric layers have been reduced to improve current driving ability of transistors. Thus, a time dependent dielectric breakdown (TDDB) characteristic corresponding to one of reliability-evaluation items on the gate dielectric layer may directly affect characteristics and/or reliability of an entire semiconductor device, as well as characteristics of a transistor.

SUMMARY

Embodiments of the inventive concepts may provide methods of manufacturing a semiconductor device capable of improving reliability of a gate dielectric layer of a transistor.

In some example embodiments, a method of manufacturing a semiconductor device may include: providing a substrate including a channel region of a transistor; forming an initial oxide layer on the channel region; and performing a thermal treatment process at least once before or after forming the initial oxide layer.

In some example embodiments, the channel region may include germanium (Ge).

In some example embodiments, the method may further include: forming a high-k dielectric layer on the initial oxide layer.

In some example embodiments, the thermal treatment process may be performed using at least one of oxygen, nitrogen, argon, or ultraviolet (UV) radiation in-situ in a process chamber in which the initial oxide layer is formed.

In some example embodiments, the thermal treatment process may be performed at a temperature in a range of 550° C. to 750° C.

In some example embodiments, the thermal treatment process may be performed using at least one of oxygen, nitrogen, or argon gas at a flow rate in a range of 100 sccm to 5000 sccm.

In some example embodiments, the thermal treatment process may be performed at a pressure in a range of 0.1 Torr to 10 Torr.

In some example embodiments, the thermal treatment process may be performed using the ultraviolet (UV) radiation at a pressure in a range of 0 Torr to 0.01 Torr.

In some example embodiments, the thermal treatment process may be performed for a time in a range of 30 seconds to 200 seconds.

In some example embodiments, a method of manufacturing a semiconductor device may include: providing a substrate having a channel region including silicon-germanium (SiGe); forming an initial oxide layer on the substrate; and performing a first thermal treatment process using at least one of oxygen, nitrogen, argon, or ultraviolet (UV) radiation in-situ before forming the initial oxide layer.

In some example embodiments, the method may further include: performing a second thermal treatment process using at least one of oxygen, nitrogen, argon, or ultraviolet (UV) radiation in-situ after forming the initial oxide layer.

In some example embodiments, the second thermal treatment process may be performed by substantially the same method as the first thermal treatment process.

In some example embodiments, each of the first and second thermal treatment processes may be performed at a temperature in a range of 550° C. to 750° C.

In some example embodiments, each of the first and second thermal treatment processes may be performed at least one of using oxygen, nitrogen, or argon gas at a flow rate in a range of 100 sccm to 5000 sccm and at a pressure in a range of 0.1 Torr to 10 Torr.

In some example embodiments, each of the first and second thermal treatment processes may be performed using the ultraviolet (UV) radiation at a pressure in a range of 0 Torr to 0.01 Torr.

In some example embodiments, the method may further include: forming a high-k dielectric layer on the initial oxide layer.

In some example embodiments, a method of manufacturing a semiconductor device may include: loading a substrate having a channel region of a transistor into a process chamber, the channel region including silicon-germanium (SiGe); performing a first thermal treatment process using at least one of oxygen, nitrogen, argon, or ultraviolet (UV) radiation on the channel region; forming an initial oxide layer on the channel region treated by the first thermal treatment process in-situ in the process chamber; and performing a second thermal treatment process using at least one of oxygen, nitrogen, argon, or ultraviolet (UV) radiation on the initial oxide layer.

In some example embodiments, the second thermal treatment process may be performed in-situ in the process chamber.

In some example embodiments, the method may further include: forming a high-k dielectric layer on the initial oxide layer after performing the second thermal treatment process.

BRIEF DESCRIPTION OF THE DRAWINGS

The inventive concepts will become more apparent in view of the attached drawings and accompanying detailed description.

DETAILED DESCRIPTION OF EXAMPLE EMBODIMENTS

Figure 1:
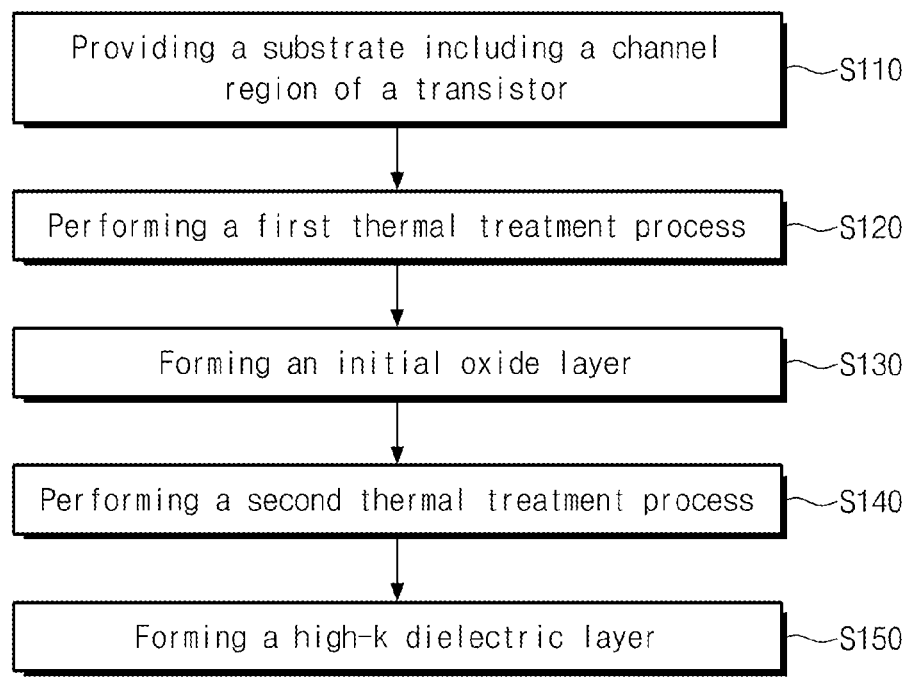
FIG. 1 is a process flow chart illustrating a method of manufacturing a semiconductor device according to some example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, example embodiments of the inventive concepts are not limited to the specific examples provided herein and are exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

The terminology used herein is for the purpose of describing particular example embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. Therefore, the example embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some example embodiments could be termed a second element in other example embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in an example two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
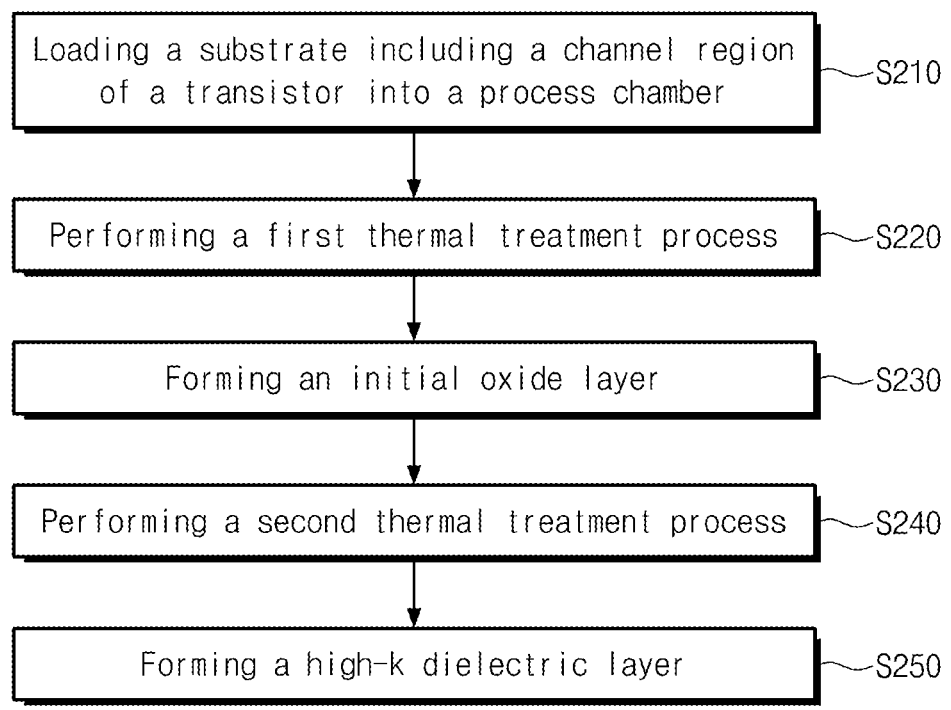
FIG. 2 is a process flow chart illustrating a method of manufacturing a semiconductor device according to other example embodiments of the inventive concepts.

Methods of manufacturing a semiconductor device according to example embodiments will be described with reference to FIGS. 1 and 2. FIG. 1 is a process flow chart illustrating a method of manufacturing a semiconductor device according to some example embodiments of the inventive concepts, and FIG. 2 is a process flow chart illustrating a method of manufacturing a semiconductor device according to other example embodiments of the inventive concepts.

Referring to FIG. 1, a method of manufacturing a semiconductor device according to some example embodiments may include providing a substrate including a channel region of a transistor (S110), performing a first thermal treatment process on the substrate (S120), forming an initial oxide layer on the substrate (S130), performing a second thermal treatment process on the initial oxide layer (S140), and/or forming a high-k dielectric layer on the initial oxide layer (S150).

In some example embodiments, one of the first thermal treatment process and the second thermal treatment process may be omitted.

The substrate may be a silicon substrate such as a bulk silicon substrate or a silicon-on-insulator (SOI) substrate. The channel region of the transistor may include germanium (Ge). For example, the channel region of the transistor may be formed of silicon-germanium (SiGe).

The first thermal treatment process may be performed on the substrate using at least one of oxygen, nitrogen, argon, or ultraviolet (UV) radiation. The first thermal treatment process may be performed at a temperature in a range of 550° C. to 750° C. In some example embodiments, the first thermal treatment process may be performed at least one of using oxygen, nitrogen, or argon gas at a flow rate in a range of 100 sccm to 5000 sccm. In some example embodiments, the first thermal treatment process may be performed at a pressure in a range of 0.1 Torr to 10 Torr. In other example embodiments, the first thermal treatment process may be performed using the ultraviolet (UV) radiation at a pressure in a range of 0 Torr to 0.01 Torr. The first thermal treatment process may be performed for a time of 30 seconds to 200 seconds.

A hydroxyl group (OH—) included in the channel region may be removed by the first thermal treatment process. Thus, it is possible to reduce or prevent the initial oxide layer from being deteriorated by the hydroxyl group (OH—) during a subsequent process of forming the initial oxide layer. As a result, reliability of the semiconductor device may be improved.

The initial oxide layer may include a silicon oxide layer and may be formed by a thermal oxidation process.

The second thermal treatment process may be performed by substantially the same method as the first thermal treatment process. However, the inventive concepts are not limited thereto. A hydroxyl group (OH—) existing in the initial oxide layer may be removed by the second thermal treatment process, thereby reducing or preventing deterioration of the initial oxide layer and/or improving the reliability of the semiconductor device.

The high-k dielectric layer may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

Referring to FIG. 2, a method of manufacturing a semiconductor device according to other example embodiments may include loading a substrate including a channel region of a transistor into a process chamber (S210), performing a first thermal treatment process on the substrate (S220), forming an initial oxide layer on the substrate (S230), performing a second thermal treatment process on the substrate including the initial oxide layer (S240), and/or forming a high-k dielectric layer on the initial oxide layer (S250).

In some example embodiments, one of the first thermal treatment process and the second thermal treatment process may be omitted.

The substrate may be a silicon substrate such as a bulk silicon substrate or a silicon-on-insulator (SOI) substrate, and the channel region of the transistor may include germanium (Ge). For example, the channel region of the transistor may be formed of silicon-germanium (SiGe).

The process chamber may include a single-wafer type chamber or a batch type chamber.

The first thermal treatment process may be performed on the substrate using at least one of oxygen, nitrogen, argon, or ultraviolet (UV) radiation. The first thermal treatment process may be performed at a temperature ranging from 550° C. to 750° C. In some example embodiments, the first thermal treatment process may be performed at least one of using oxygen, nitrogen, or argon gas at a flow rate in a range of 100 sccm to 5000 sccm. In some example embodiments, the first thermal treatment process may be performed at a pressure in a range of 0.1 Torr to 10 Torr. In other example embodiments, the first thermal treatment process may be performed using the ultraviolet (UV) radiation at a pressure in a range of 0 Torr to 0.01 Torr. The first thermal treatment process may be performed for a time in a range of 30 seconds to 200 seconds.

A hydroxyl group (OH—) included in the channel region may be removed by the first thermal treatment process. Thus, it is possible to reduce or prevent the initial oxide layer from being deteriorated by the hydroxyl group (OH—) during a subsequent process of forming the initial oxide layer. As a result, reliability of the semiconductor device may be improved.

The initial oxide layer may include a silicon oxide layer and may be formed by a thermal oxidation process.

The second thermal treatment process may be performed by substantially the same method as the first thermal treatment process. However, the inventive concepts are not limited thereto. A hydroxyl group (OH—) existing in the initial oxide layer may be removed by the second thermal treatment process, thereby reducing or preventing deterioration of the initial oxide layer and/or improving the reliability of the semiconductor device. In some example embodiments, at least one of the first thermal treatment process and the second thermal treatment process may be performed in-situ in the process chamber in which the initial oxide layer is formed.

The high-k dielectric layer may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

A semiconductor device according to some example embodiments of the inventive concepts will be described with reference to FIGS. 3, 4A and 4B.

Figure 3:
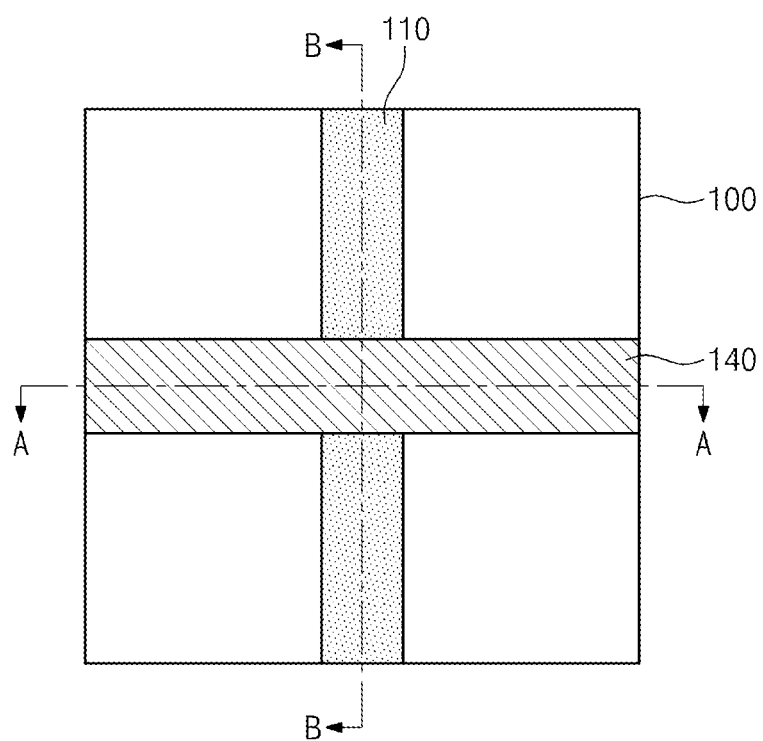
FIG. 3 is a plan view illustrating a semiconductor device according to some example embodiments of the inventive concepts.

FIG. 3 is a plan view illustrating a semiconductor device according to some example embodiments of the inventive concepts.

Referring to FIG. 3, a semiconductor device may include a substrate 100 on which a channel region 110 of a transistor is formed. A gate electrode 140 may be formed to intersect the channel region 110.

The substrate 100 may be a silicon substrate such as a bulk silicon substrate or a silicon-on-insulator (SOI) substrate, and the channel region 110 of the transistor may include germanium (Ge). For example, the channel region 110 of the transistor may be formed of silicon-germanium (SiGe).

The gate electrode 140 may include a metal layer including at least one of titanium (Ti), titanium nitride (TiN), tantalum (Ta), tantalum nitride (TaN), tungsten (W), copper (Cu), aluminum (Al), or any mixture thereof.

A source/drain region may be formed in the channel region 110 not overlapping with the gate electrode 140 by a subsequent process.

Figure 4A:
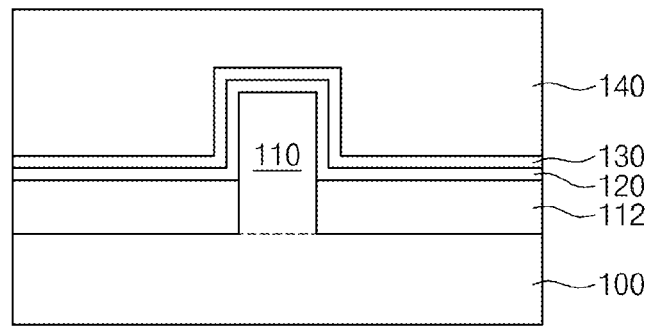
FIG. 4A is a cross-sectional view taken along a line A-A of FIG. 3.
Figure 4B:
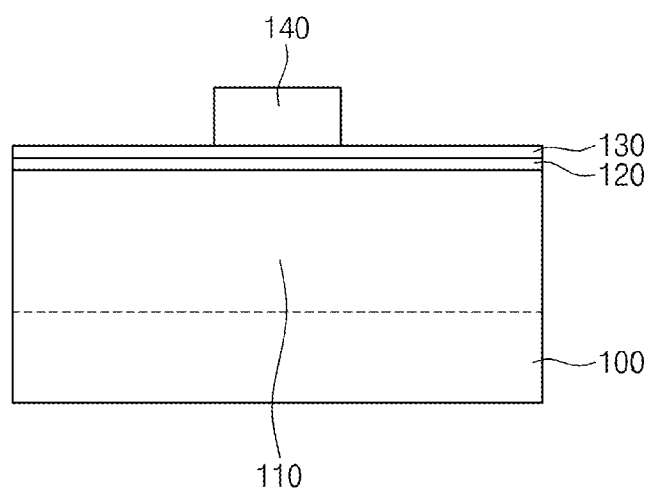
FIG. 4B is a cross-sectional view taken along a line B-B of FIG. 3.

FIG. 4A is a cross-sectional view taken along a line A-A of FIG. 3, and FIG. 4B is a cross-sectional view taken along a line B-B of FIG. 3.

Referring to FIGS. 4A and 4B, the channel region 110 of the transistor may be formed to protrude from the substrate 100. In some example embodiments, after a channel layer may be formed on the substrate 100 by a silicon epitaxial growth method, a patterning process that includes a photolithography process and an etching process may be performed on the channel layer to form the channel region 110. The channel region 110 may include germanium (Ge). For example, the channel region 110 may be formed of silicon-germanium (SiGe).

A device isolation layer 112 may be formed on the substrate 100. The device isolation layer 112 may be formed to cover a portion of a sidewall of the channel region 110. The device isolation layer 112 may include a silicon oxide layer.

An initial oxide layer 120 may be formed on the protruding channel region 110. The initial oxide layer 120 may include a silicon oxide layer and be formed by a thermal oxidation process.

A high-k dielectric layer 130 may be formed on the initial oxide layer 120. The high-k dielectric layer 130 may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

The gate electrode 140 may be formed on the high-k dielectric layer 130. The gate electrode 140 may include a metal layer including at least one of titanium (Ti), titanium nitride (TiN), tantalum (Ta), tantalum nitride (TaN), tungsten (W), copper (Cu), aluminum (Al), or any mixture thereof.

A method of fabricating a semiconductor device according to some example embodiments of the inventive concepts will be described with reference to FIGS. 5A to 5F. FIGS. 5A to 5F are perspective views illustrating a method of manufacturing a semiconductor device according to some example embodiments of the inventive concepts.

Figure 5A:
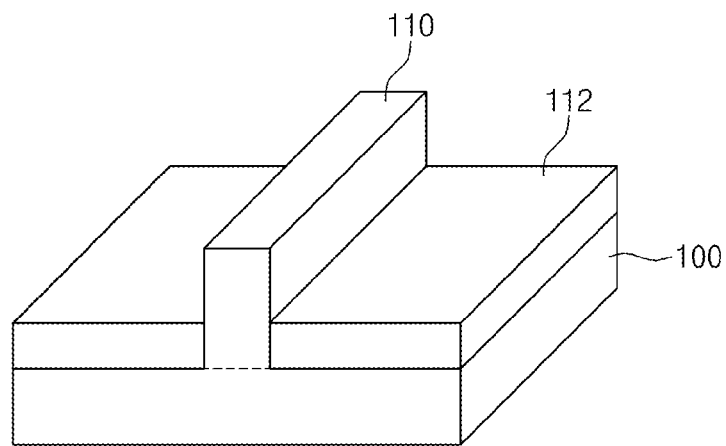
FIGS. 5A to 5F are perspective views illustrating a method of manufacturing a semiconductor device according to some example embodiments of the inventive concepts.

Referring to FIG. 5A, a channel region 110 is formed on a substrate 100. The substrate 100 may be a silicon substrate such as a bulk silicon substrate or a silicon-on-insulator (SOI) substrate.

The channel region 110 may be formed to protrude from the substrate 100. In some example embodiments, after a mask pattern may be formed on the substrate 100, the substrate 100 may be etched by a predetermined or desired depth using the mask pattern as an etch mask to form the channel region 110. In other example embodiments, a channel layer may be formed on the substrate 100 by a silicon epitaxial growth method, and a patterning process including a photolithography process and an etching process may be then performed on the channel layer to form the channel region 110. The channel region 110 may include germanium (Ge). For example, the channel region 110 may be formed of silicon-germanium (SiGe).

A device isolation layer 112 may be formed on the substrate 100. The device isolation layer 112 may include a silicon oxide layer that is formed by a high-density plasma (HDP) deposition method or a flowable chemical vapor deposition (FCVD) method. In some example embodiments, a silicon oxide layer may be formed on the substrate 100 to sufficiently cover the channel region 110, and a planarization process and an etch-back process may be performed on the silicon oxide layer to expose a top surface and a sidewall of the channel region 110 and to form the device isolation layer 112. A height of the exposed sidewall of the channel region 110 may be in a range of, but not limited to, 200 Å to 500 Å.

Figure 5B:
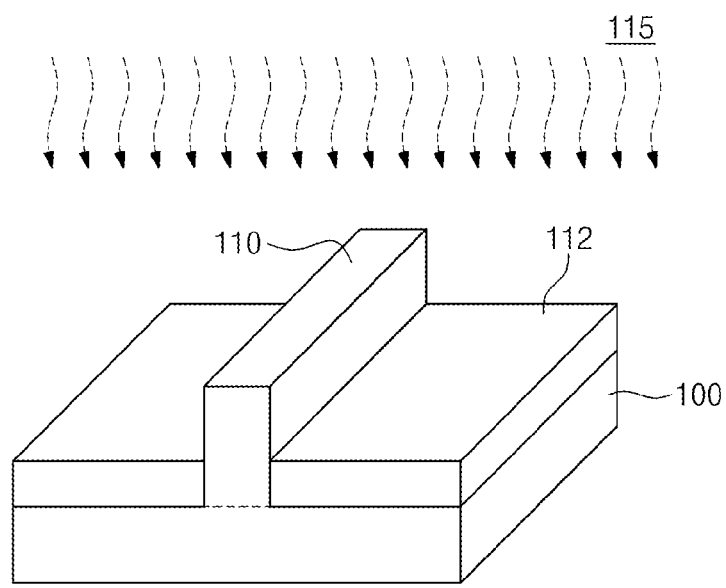

Referring to FIG. 5B, a first thermal treatment process 115 may be performed on the exposed channel region 110. The first thermal treatment process 115 may be performed using at least one of oxygen, nitrogen, argon, or ultraviolet (UV) radiation at a temperature in a range of 550° C. to 750° C. In some example embodiments, the first thermal treatment process 115 may be performed at least one of using oxygen, nitrogen, or argon gas at a flow rate in a range of 100 sccm to 5000 sccm. In some example embodiments, the first thermal treatment process 115 may be performed at a pressure in a range of 0.1 Torr to 10 Torr. Alternatively, the first thermal treatment process 115 may be performed using the ultraviolet (UV) radiation at a pressure in a range of 0 Torr to 0.01 Torr. The first thermal treatment process 115 may be performed for a time of 30 seconds to 200 seconds.

A hydroxyl group (OH—) included in the channel region 110 may be removed by the first thermal treatment process 115. Thus, it is possible to reduce or prevent an initial oxide layer from being deteriorated by the hydroxyl group (OH—) during a subsequent process of forming the initial oxide layer. As a result, it is possible to improve reliability of the semiconductor device.

Figure 5C:
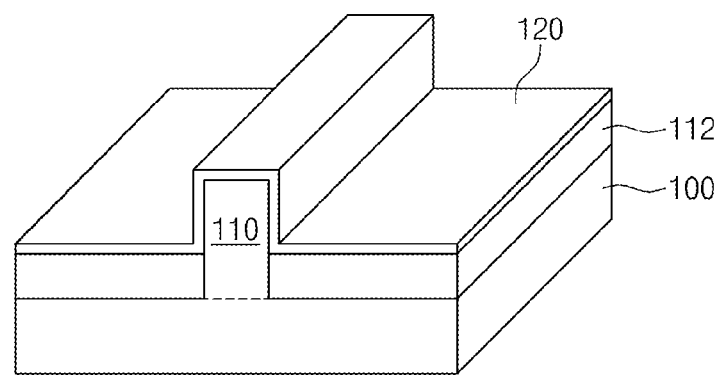

Referring to FIG. 5C, an initial oxide layer 120 may be formed on the channel region 110. The initial oxide layer 120 may include a silicon oxide layer formed by a thermal oxidation process or a chemical vapor deposition (CVD) process.

Figure 5D:
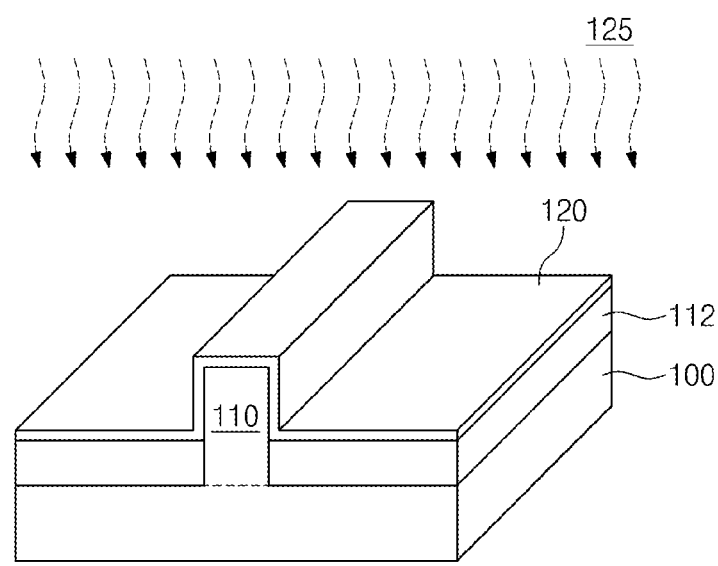

Referring to FIG. 5D, a second thermal treatment 125 may be performed on the initial oxide layer 120. The second thermal treatment 125 may be performed by substantially the same method as the first thermal treatment process 115. However, the inventive concepts are not limited thereto. A hydroxyl group (OH—) existing in the initial oxide layer 120 may be removed by the second thermal treatment process 125, thereby reducing or preventing deterioration of the initial oxide layer 120 and/or improving the reliability of the semiconductor device.

Figure 5E:
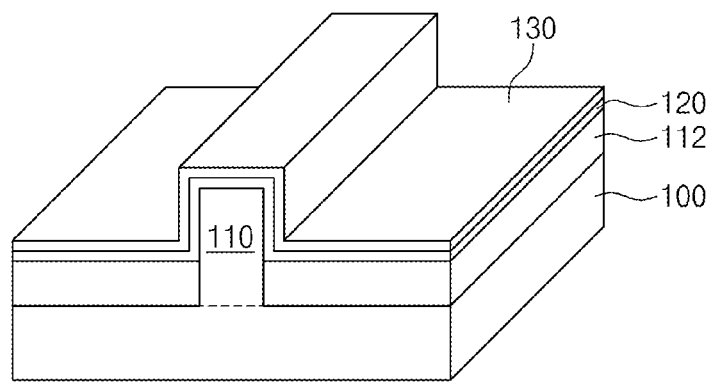

Referring to FIG. 5E, a high-k dielectric layer 130 may be formed on the initial oxide layer 120. The high-k dielectric layer 130 may be formed by an atomic layer deposition (ALD) process or a chemical vapor deposition (CVD) process. The high-k dielectric layer 130 may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

Figure 5F:
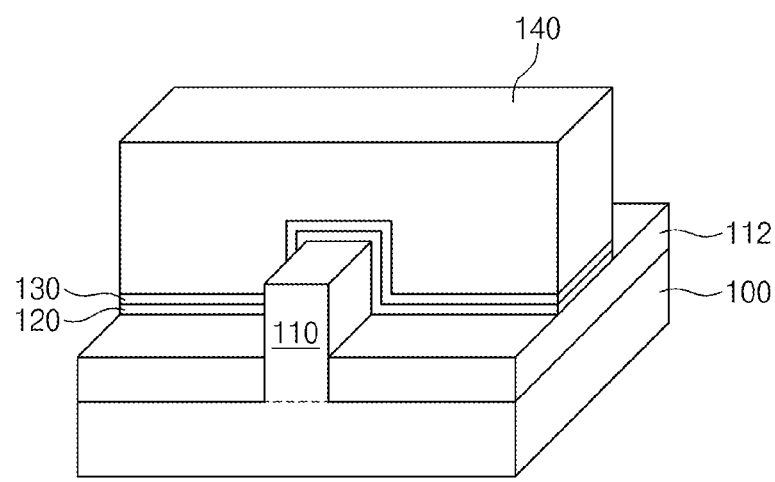

Referring to FIG. 5F, a gate electrode 140 may be formed on the high-k dielectric layer 130. The gate electrode 140 may include a metal layer including at least one of titanium (Ti), titanium nitride (TiN), tantalum (Ta), tantalum nitride (TaN), tungsten (W), copper (Cu), aluminum (Al), or any mixture thereof.

After the processes described above are performed, processes of forming an interlayer insulating layer, an interconnection, and/or a wire may be further performed to manufacture the semiconductor device according to some example embodiments of the inventive concepts.

A method of manufacturing a semiconductor device according to other example embodiments of the inventive concepts will be described with reference to FIGS. 6A to 6K. FIGS. 6A to 6K are perspective views illustrating a method of manufacturing a semiconductor device according to other example embodiments of the inventive concepts.

Figure 6A:
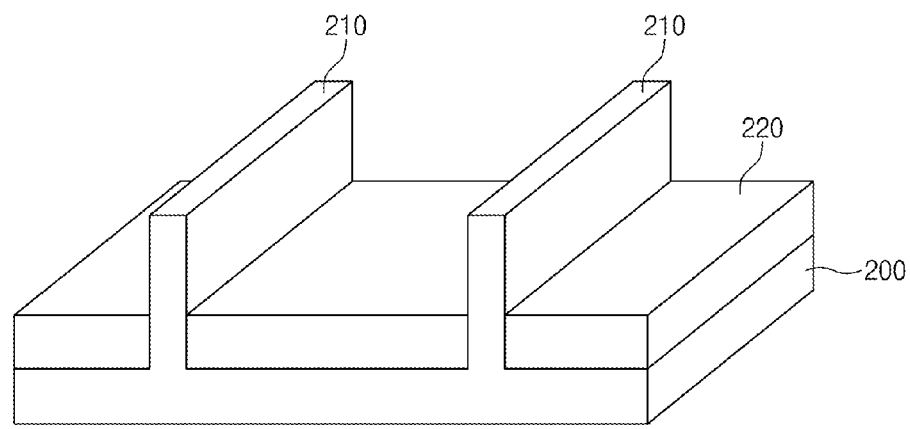
FIGS. 6A to 6K are perspective views illustrating a method of manufacturing a semiconductor device according to other example embodiments of the inventive concepts.

Referring to FIG. 6A, a plurality of channel regions 210 may be formed on a substrate 200. The substrate 200 may be a silicon substrate such as a bulk silicon substrate or a silicon-on-insulator (SOI) substrate.

Each of the channel regions 210 may be formed to have a shape protruded from the substrate 200. In some example embodiments, after a mask pattern may be formed on the substrate 200, the substrate 200 may be etched by a predetermined or desired depth using the mask pattern as an etch mask to form the channel regions 210. In other example embodiments, a channel layer may be formed on the substrate 200 by a silicon epitaxial growth method, and a patterning process that includes a photolithography process and an etching process may be then performed on the channel layer to form the channel regions 210. The channel regions 210 may include germanium (Ge). For example, the channel regions 210 may be formed of silicon-germanium (SiGe).

A device isolation layer 220 may be formed on the substrate 200. The device isolation layer 220 may include a silicon oxide layer that is formed by a high-density plasma (HDP) deposition method or a flowable chemical vapor deposition (FCVD) method. In some example embodiments, a silicon oxide layer may be formed on the substrate 200 to sufficiently cover the channel regions 210, and a planarization process and an etch-back process may be performed on the silicon oxide layer to expose a top surface and a sidewall of the channel regions 210 and to form the device isolation layer 220. A height of the exposed sidewall of the channel region 210 may be in a range of 200 Å to 500 Å. However, the inventive concepts are not limited thereto.

Figure 6B:
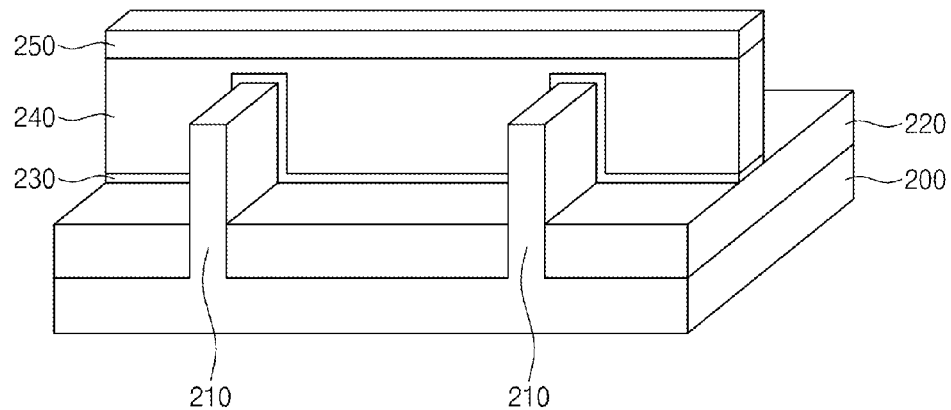

Referring to FIG. 6B, a dummy gate pattern 240 may be formed to cross over the channel regions 210. The dummy gate pattern 240 may include poly-crystalline silicon. A sacrificial insulating layer 230 may be formed under the dummy gate pattern 240, and a hard mask pattern 250 may be formed on the dummy gate pattern 240.

In some example embodiments, a sacrificial insulating layer 230 and a poly-crystalline silicon layer may be formed on the channel regions 210, and a chemical mechanical polishing (CMP) process or an etch-back process may be performed to planarize a top surface of the poly-crystalline silicon layer. The hard mask pattern 250 may be formed on the planarized top surface of the poly-crystalline silicon layer, and the poly-crystalline silicon layer may be then patterned using the hard mask pattern 250 as an etch mask to form the dummy gate pattern 240.

Figure 6C:
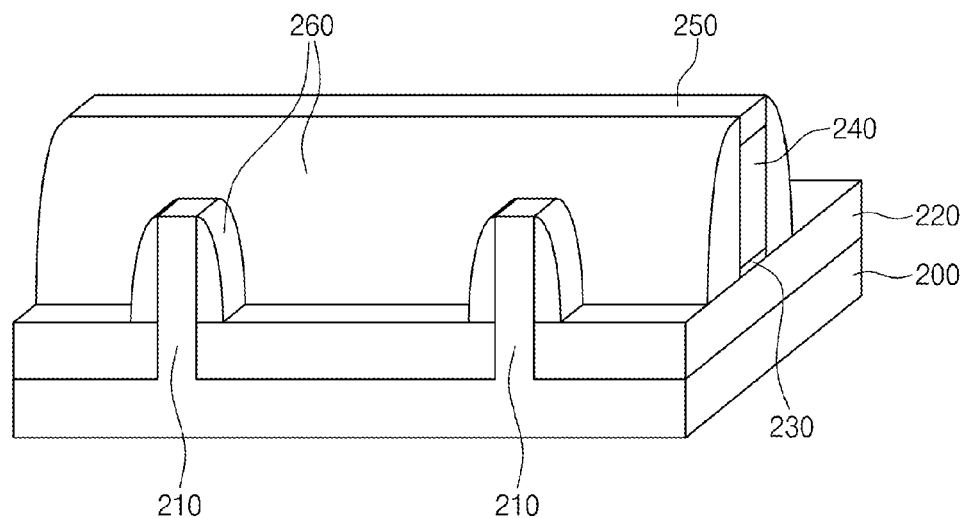

Referring to FIG. 6C, a spacer 260 may be formed on a sidewall of the dummy gate pattern 240 and sidewalls of the channel regions 210. The spacer 260 may include at least one of silicon nitride (SiN) and silicon oxynitride (SiON). In some example embodiments, a silicon nitride layer and/or a silicon oxynitride layer may be formed on the hard mask pattern 250 and the channel regions 210, and then, an etch-back process may be performed on the silicon nitride layer and/or the silicon oxynitride layer to expose the device isolation layer 220 formed on the substrate 200. Thus, the spacer 260 may be formed. A top surface of the hard mask pattern 250 and top surfaces of the channel regions 210 may be exposed together.

Figure 6D:
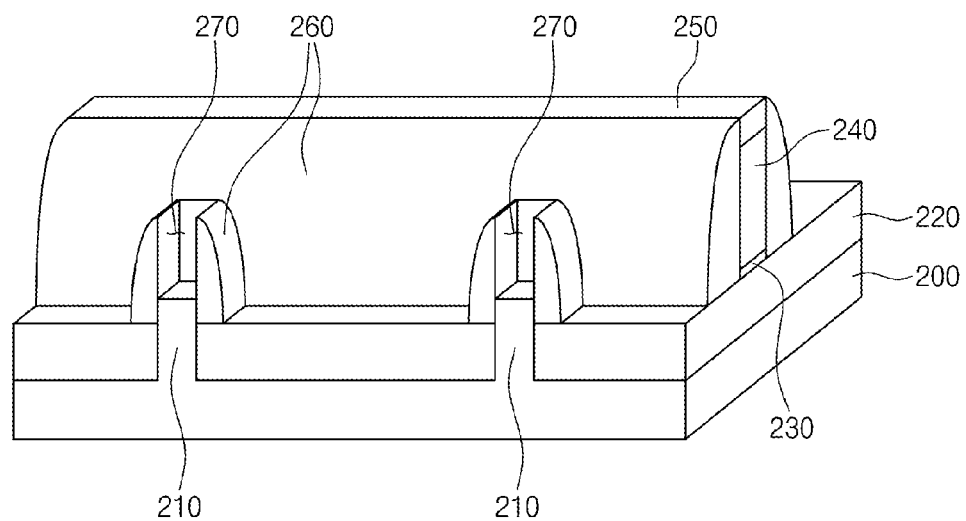

Referring to FIG. 6D, the top surfaces of the channel regions 210 may be etched by a predetermined or desired depth to form a plurality of first recess regions 270. The etched surfaces of the channel regions 210 (e.g., bottom surfaces of the first recess regions 270) may be a little higher than a top surface of the device isolation layer 220. However, the inventive concepts are not limited thereto.

Figure 6E:
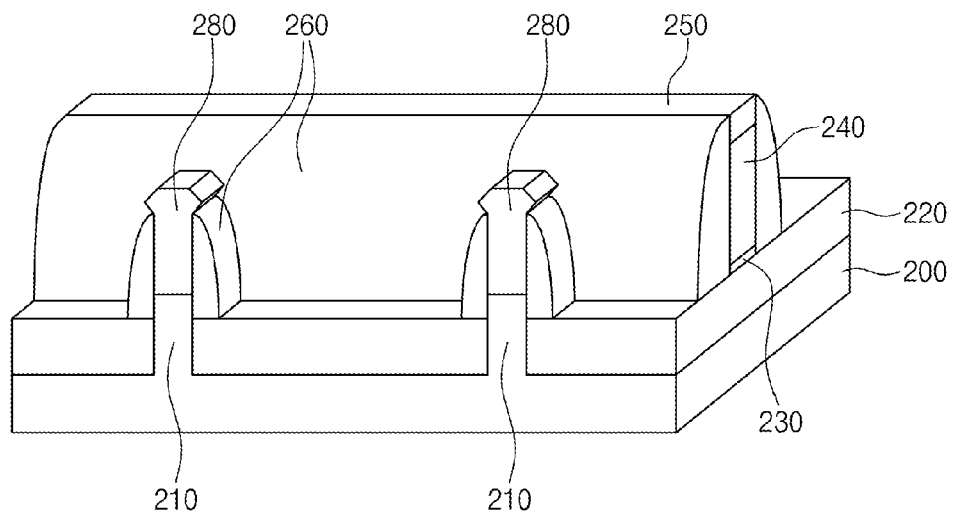

Referring to FIG. 6E, an epitaxial layer 280 may be formed in each of the first recess regions 270 of FIG. 6D. A top surface of the epitaxial layer 280 may be formed to protrude from the first recess regions 270. The top surface of the epitaxial layer 280 may be lower than the top surface of the hard mask pattern 250.

The epitaxial layer 280 may be a source/drain region of an N-type metal-oxide-semiconductor (NMOS) or P-type metal-oxide-semiconductor (PMOS) transistor, and N-type or P-type dopants may be doped in-situ during the formation of the epitaxial layer 280.

Figure 6F:
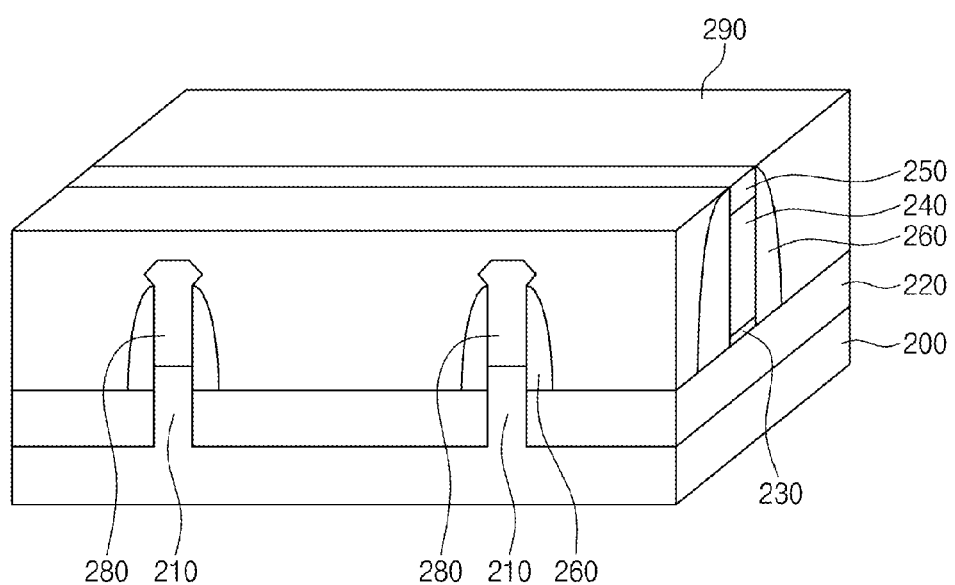

Referring to FIG. 6F, an interlayer insulating layer 290 may be formed to cover the epitaxial layer 280, the device isolation layer, and the spacer 260. The interlayer insulating layer 290 may include a silicon oxide layer that is formed by a high-density plasma (HDP) deposition method, a spin-on-glass (SOG) method, a chemical vapor deposition (CVD) method, or a flowable chemical vapor deposition (FCVD) method.

In some example embodiments, a silicon oxide layer may be formed on the hard mask pattern 250 and the spacer 260, and a planarization process (e.g., an etch-back process or a chemical mechanical polishing (CMP) process) may be performed on the silicon oxide layer until the hard mask pattern 250 is exposed, thereby forming the interlayer insulating layer 290.

Figure 6G:
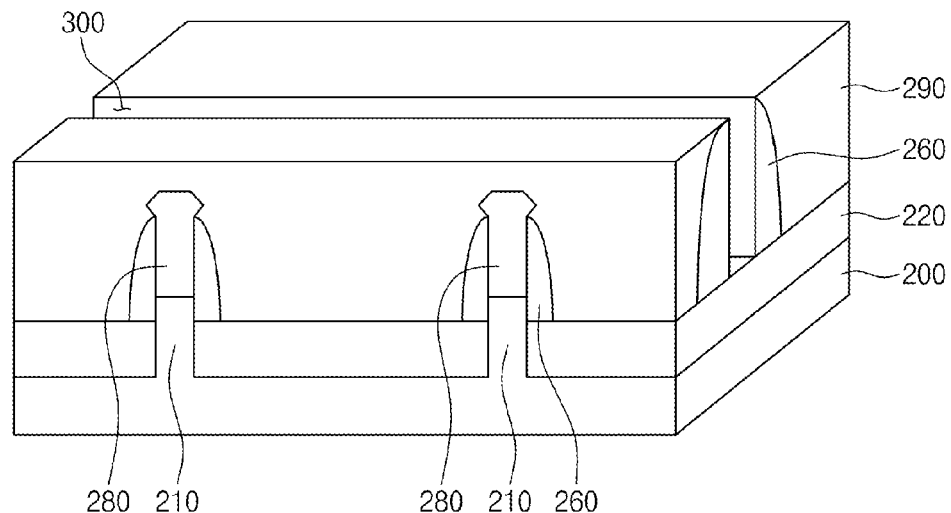

Referring to FIG. 6G, the hard mask pattern 250, the dummy gate pattern 240, and the sacrificial insulating layer 230 may be removed to form a second recess region 300. Portions of the channel regions 210 and a portion of the device isolation layer 220 may be exposed at a bottom of the second recess region 300.

Figure 6H:
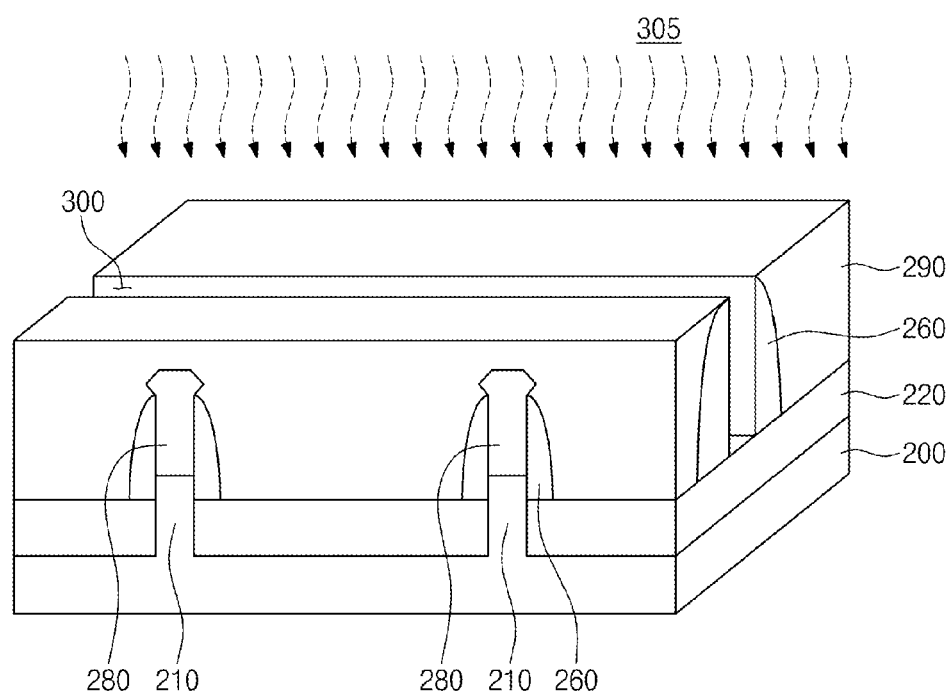

Referring to FIG. 6H, a first thermal treatment process 305 may be performed on the exposed channel regions 210. The first thermal treatment process 305 may be performed using at least one of oxygen, nitrogen, argon, or ultraviolet (UV) radiation. The first thermal treatment process 305 may be performed at a temperature in a range of 550° C. to 750° C. In some example embodiments, the first thermal treatment process 305 may be performed at least one of using oxygen, nitrogen, or argon gas at a flow rate ranging from 100 sccm to 5000 sccm and at a pressure ranging from 0.1 Torr to 10 Torr. Alternatively, the first thermal treatment process 305 may be performed using the ultraviolet (UV) radiation at a pressure ranging from 0 Torr to 0.01 Torr. The first thermal treatment process 305 may be performed for a time in a range of 30 seconds to 200 seconds.

A hydroxyl group (OH—) included in the channel regions 210 may be removed by the first thermal treatment process 305. Thus, it is possible to reduce or prevent an initial oxide layer from being deteriorated by the hydroxyl group (OH—) during a subsequent process of forming the initial oxide layer. As a result, reliability of the semiconductor device may be improved.

Figure 6I:
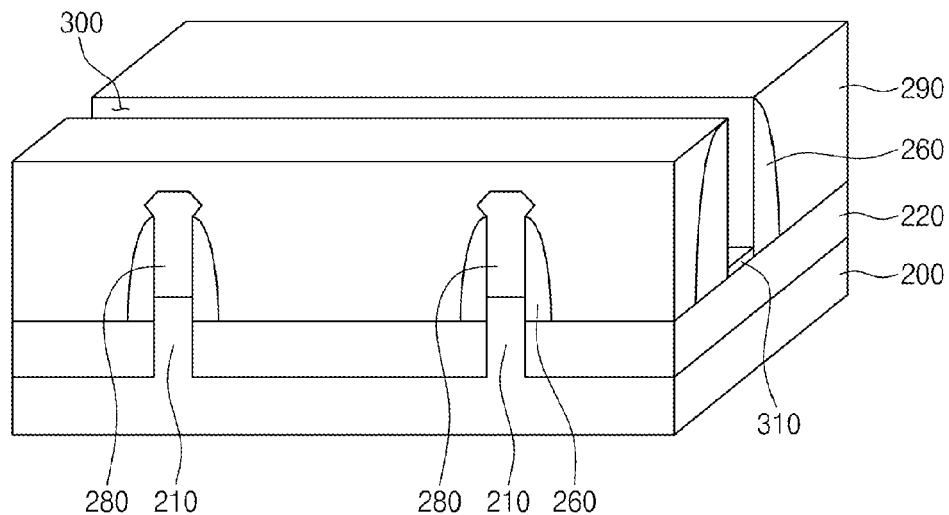

Referring to FIG. 6I, an initial oxide layer 310 may be formed on the channel regions 110 in the second recess region 300. The initial oxide layer 310 may include a silicon oxide layer formed by a thermal oxidation process.

Figure 6J:
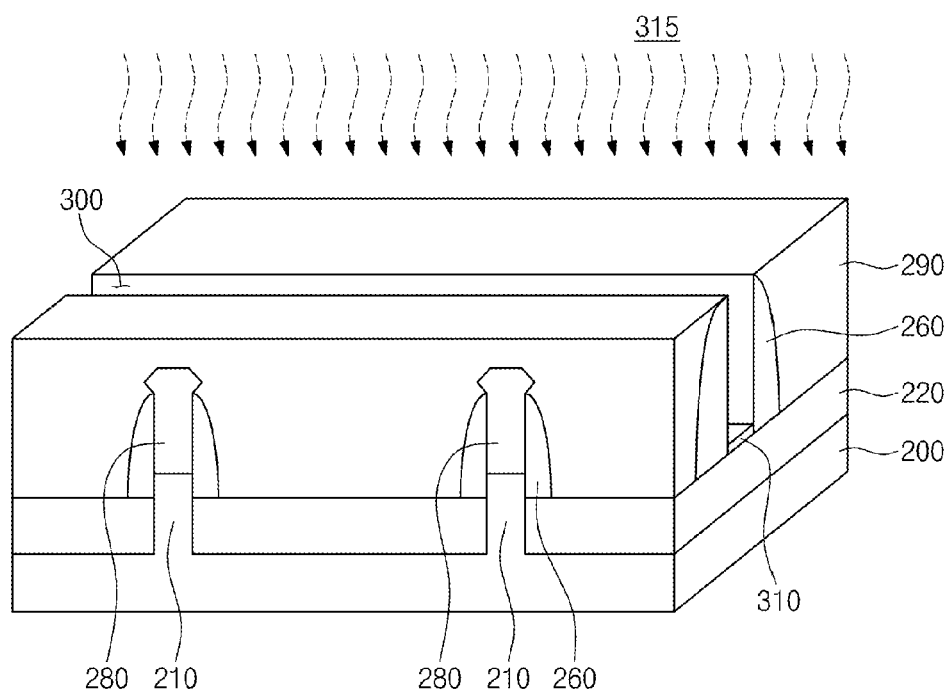

Referring to FIG. 6J, a second thermal treatment 315 may be performed on the initial oxide layer 310. The second thermal treatment 315 may be performed by substantially the same method as the first thermal treatment process 305. However, the inventive concepts are not limited thereto. A hydroxyl group (OH—) existing in the initial oxide layer 310 may be removed by the second thermal treatment process 315, thereby reducing or preventing deterioration of the initial oxide layer 310 and/or improving the reliability of the semiconductor device.

Figure 6K:
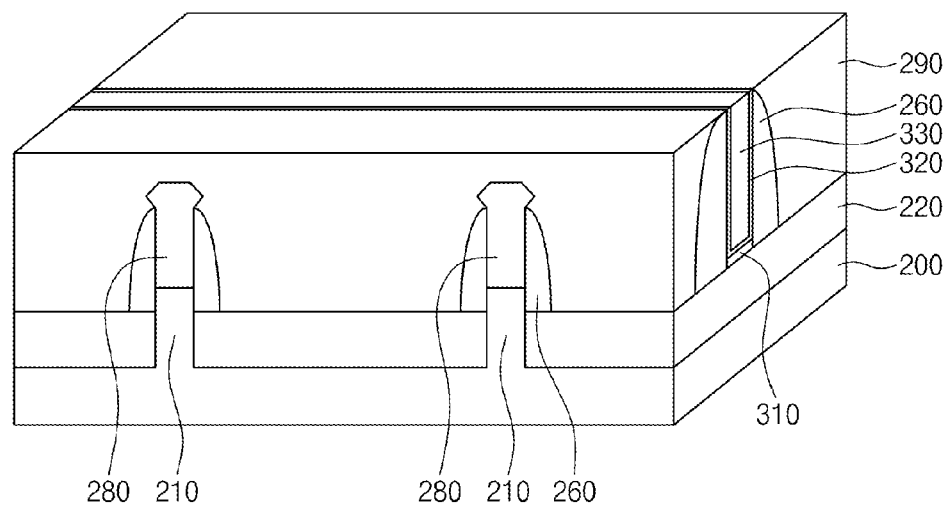

Referring to FIG. 6K, a high-k dielectric layer 320 may be formed on the initial oxide layer 310. The high-k dielectric layer 320 may be formed by an atomic layer deposition (ALD) process or a chemical vapor deposition (CVD) process. The high-k dielectric layer 320 may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

A gate electrode 330 may be formed on the high-k dielectric layer 320. The gate electrode 330 may include a metal layer including at least one of titanium (Ti), titanium nitride (TiN), tantalum (Ta), tantalum nitride (TaN), tungsten (W), copper (Cu), aluminum (Al), or any mixture thereof.

After the aforementioned processes are performed, processes of forming an interlayer insulating layer, an interconnection, and/or a wire may be further performed to manufacture the semiconductor device according to other example embodiments of the inventive concepts.

Figure 7:
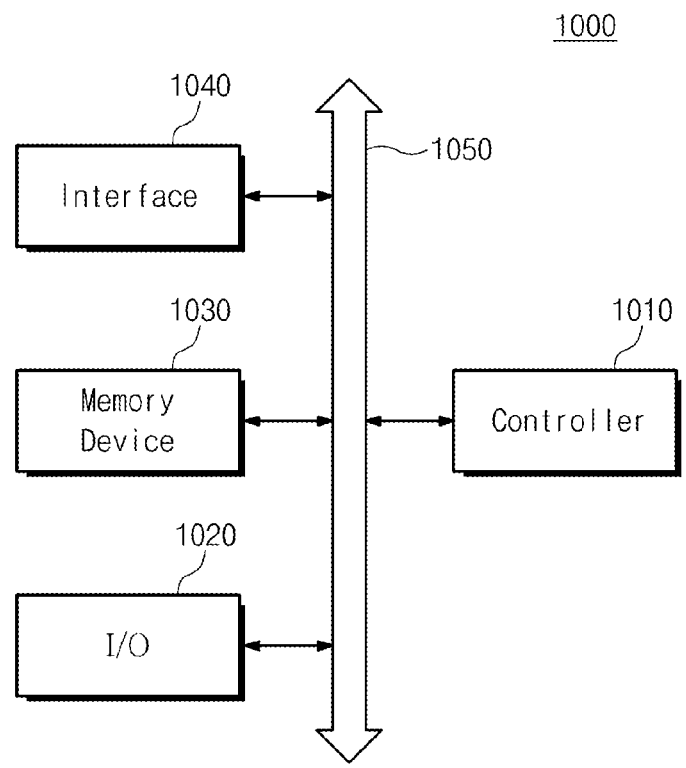
FIG. 7 is a schematic block diagram illustrating a system including a semiconductor device according to example embodiments of the inventive concepts.

FIG. 7 is a schematic block diagram illustrating a system including a semiconductor device according to some example embodiments of the inventive concepts.

Referring to FIG. 7, a system 1000 includes a controller 1010, an input/output (I/O) unit 1020, a memory device 1030, and an interface unit 1040. The system 1000 may be a mobile system or a system transmitting or receiving data. In some example embodiments, the mobile system may be a personal digital assistant (PDA), a portable computer, a web tablet, a wireless phone, a mobile phone, a digital music player, or a memory card. The controller 1010 may control executing programs in the system 1000. For example, the controller 1010 may include at least one of a microprocessor, a digital signal processor, a microcontroller, or other logic devices. The other logic devices may have a similar function to any one of the microprocessor, the digital signal processor, and the microcontroller. The I/O unit 1020 may be used to input data into or output data from the system 1000. In other words, the system 1000 may be connected to an external system (e.g., a personal computer or a network) through the I/O unit 1020 so as to exchange data with the external system. The I/O unit 1020 may include at least one of, for example, a keypad, a keyboard, or a display device.

The memory device 1030 may store data and/or codes for operating the controller 1010 and/or may store data processed by the controller 1010. The controller 1010 and/or the memory device 1030 may include the semiconductor device having the NMOS or PMOS transistor according to some example embodiments of the inventive concepts. For example, the controller 1010 and/or the memory device 1030 may include at least one of the semiconductor devices described with reference to FIGS. 1 to 6K.

The interface unit 1040 may correspond to a data transfer path between the system 1000 and an external system. The controller 1010, the I/O unit 1020, the memory device 1030, and the interface unit 1040 may communicate with each other through a data bus 1050. The system 1000 may be applied to a mobile phone, a MP3 player, a navigation system, a portable multimedia player (PMP), a solid state disk (SSD), or household appliances.

Figure 8:
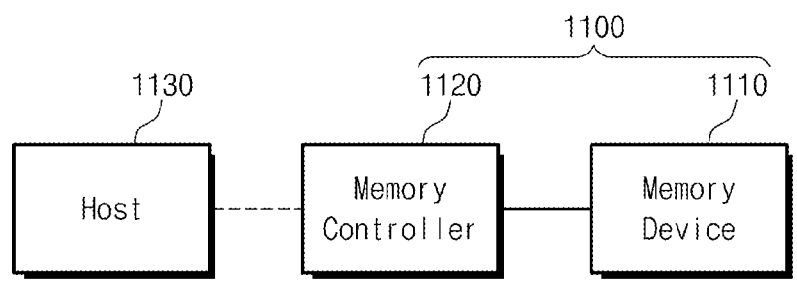
FIG. 8 is a schematic block diagram illustrating a memory card including a semiconductor device according to example embodiments of the inventive concepts.

FIG. 8 is a schematic block diagram illustrating a memory card including a semiconductor device according to some example embodiments of the inventive concepts.

Referring to FIG. 8, a memory card 1100 may include a memory device 1110 and a memory controller 1120. The memory device 1110 may store data and may include at least one of the semiconductor devices described with reference to FIGS. 1 to 6K.

The memory controller 1120 may read data stored in the memory device 1110 or may store data into the memory device 1110 in response to read/write request of a host 1130. The memory controller 1120 may include at least one of the semiconductor devices described with reference to FIGS. 1 to 6K.

According to the aforementioned example embodiments of the inventive concepts, the thermal treatment process may be performed at least once before and/or after the gate dielectric layer is formed on the channel region of the transistor, thereby improving the reliability of the semiconductor device.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a semiconductor device, the method comprising:
   providing a substrate having a channel region of a transistor, the channel region protruding upwardly from the substrate and including silicon-germanium (SiGe);
   forming an initial oxide layer on the protruding channel region;
   performing a thermal treatment process at least once before forming the initial oxide layer so as to remove a hydroxyl group (OH—) in the channel region; and
   forming a high-k dielectric layer on the initial oxide layer,
   wherein the thermal treatment process is performed using the ultraviolet (UV) radiation at a pressure in a range of 0 Torr to 0.01 Torr.

2. The method of claim 1, wherein the thermal treatment process is performed in-situ using at least one of oxygen, nitrogen, argon, or ultraviolet (UV) radiation in a process chamber in which the initial oxide layer is formed.

3. The method of claim 2, wherein the thermal treatment process is performed at a temperature in a range of 550° C. to 750° C.

4. The method of claim 3, wherein the thermal treatment process is performed using at least one of oxygen, nitrogen, or argon gas at a flow rate in a range of 100 sccm to 5000 sccm.

5. The method of claim 3, wherein the thermal treatment process is performed for a time in a range of 30 seconds to 200 seconds.

6. A method of manufacturing a semiconductor device, the method comprising:
   providing a substrate having a channel region protruding upwardly from the substrate and including silicon-germanium (SiGe);
   forming an initial oxide layer on the substrate; and
   performing a first thermal treatment process on the protruding channel region which is exposed using at least one of oxygen, nitrogen, argon, or ultraviolet (UV) radiation in-situ before forming the initial oxide layer so as to remove a hydroxyl group (OH—) in the protruding channel region,
   wherein the first thermal treatment process is performed using the ultraviolet (UV) radiation at a pressure in a range of 0 Torr to 0.01 Torr.

7. The method of claim 6, further comprising:
performing a second thermal treatment process using at least one of oxygen, nitrogen, argon, or ultraviolet (UV) radiation in-situ after forming the initial oxide layer so as to remove a hydroxyl group (OH—) in the initial oxide layer,
wherein the initial oxide layer includes silicon oxide ($SiO_2$).

8. The method of claim 7, wherein the second thermal treatment process is performed by substantially the same method as the first thermal treatment process.

9. The method of claim 8, wherein each of the first and second thermal treatment processes is performed at a temperature in a range of 550° C. to 750° C.

10. The method of claim 9, wherein each of the first and second thermal treatment processes is performed using at least one of oxygen, nitrogen, or argon gas at a flow rate in a range of 100 sccm to 5000 sccm.

11. The method of claim 9, further comprising forming a high-k dielectric layer on the initial oxide layer.

12. A method of manufacturing a semiconductor device, the method comprising:
loading a substrate having a channel region of a transistor into a process chamber, the channel region protruding upwardly from the substrate and including silicon-germanium (SiGe);
performing a first thermal treatment process using at least one of oxygen, nitrogen, argon, or ultraviolet (UV) radiation on the protruding channel region which is exposed so as to remove a hydroxyl group (OH—) in the protruding channel region;
forming an initial oxide layer on the protruding channel region treated by the first thermal treatment process in the process chamber in-situ, the initial oxide layer including silicon oxide ($SiO_2$); and
performing a second thermal treatment process using at least one of oxygen, nitrogen, argon, or ultraviolet (UV) radiation on the initial oxide layer so as to remove a hydroxyl group (OH—) in the initial oxide layer,
wherein the first thermal treatment process is performed using the ultraviolet (UV) radiation at a pressure in a range of 0 Torr to 0.01 Torr.

13. The method of claim 12, wherein the second thermal treatment process is performed in-situ in the process chamber.

14. The method of claim 12, wherein each of the first and second thermal treatment processes is performed at a temperature in a range of 550° C. to 750° C.

15. The method of claim 12, further comprising forming a high-k dielectric layer on the initial oxide layer after performing the second thermal treatment process.

* * * * *